(12) United States Patent
Chen et al.

(10) Patent No.: US 12,740,455 B2
(45) Date of Patent: Sep. 15, 2026

(54) ELECTRONIC PACKAGE, PACKAGE SUBSTRATE AND MANUFACTURING METHOD THEREOF

(71) Applicant: AaltoSemi Inc., Nanjing City (CN)

(72) Inventors: Yin-Ju Chen, Nanjing City (CN); Shi-Wei Lv, Nanjing City (CN); Min-Yao Chen, Nanjing City (CN); Andrew C. Chang, Nanjing City (CN)

(73) Assignee: AALTOSEMI INC., Nanjing City (CN)

( * ) Notice: Subject to any disclaimer, the term of this patent is extended or adjusted under 35 U.S.C. 154(b) by 353 days.

(21) Appl. No.: 18/442,566

(22) Filed: Feb. 15, 2024

(65) Prior Publication Data

US 2024/0282683 A1 Aug. 22, 2024

(30) Foreign Application Priority Data

Feb. 16, 2023 (TW) ................................ 112105615

(51) Int. Cl.

| | |
|---|---|
| ***H10W 70/685*** | (2026.01) |
| ***H10W 40/25*** | (2026.01) |
| ***H10W 42/00*** | (2026.01) |
| ***H10W 70/05*** | (2026.01) |
| ***H10W 90/00*** | (2026.01) |

(52) U.S. Cl.

CPC ......... *H10W 70/685* (2026.01); *H10W 70/05* (2026.01); *H10W 90/00* (2026.01); *H10W 90/401* (2026.01); *H10W 40/25* (2026.01); *H10W 42/121* (2026.01); *H10W 90/724* (2026.01)

(58) Field of Classification Search

None

See application file for complete search history.

(56) References Cited

U.S. PATENT DOCUMENTS

2022/0068814 A1* 3/2022 Kim .................... H10W 20/427
2022/0336336 A1* 10/2022 Kim ...................... H10W 70/09

* cited by examiner

*Primary Examiner* — Bo B Jang
(74) *Attorney, Agent, or Firm* — Day Pitney LLP; Richard B. Emmons

(57) ABSTRACT

A package substrate is provided, in which a second dielectric layer with a smaller CTE and a third dielectric layer with a larger CTE are formed on two opposite sides of a wiring structure including a first dielectric layer, respectively, so as to avoid too large a difference in CTE of the wiring structure between two sides thereof, thereby preventing warpage from occurring to the package substrate.

10 Claims, 6 Drawing Sheets

ELECTRONIC PACKAGE, PACKAGE SUBSTRATE AND MANUFACTURING METHOD THEREOF

CROSS-REFERENCE TO RELATED APPLICATION

This application claims the benefit of priority of Taiwan Patent Application No. 112105615, filed Feb. 16, 2023, the entire contents of which are hereby incorporated by reference.

BACKGROUND

1. Technical Field

The present disclosure relates to a semiconductor packaging process, and more particularly, to an electronic package and a package substrate and a manufacturing method thereof for preventing warpage in the process.

2. Description of Related Art

With the booming development of the electronics industry, electronic products tend to be light, thin, short and small in form, while in function they are developing toward high performance, high functionality and high speed.

There are many technologies currently applied in the field of chip packaging, for example, flip-chip package modules such as chip scale package (CSP), direct chip attached (DCA) and multi-chip module (MCM), or chip stacking technology that stacks chips in three dimensions for integration into a three-dimensional integrated circuit (3D IC).

FIG. 1 is a schematic cross-sectional view of a semiconductor package 1 of a conventional 3D IC chip stack. As shown in FIG. 1, a manufacturing method of the semiconductor package 1 is to first provide a through-silicon interposer (TSI) 10, wherein the through-silicon interposer 10 has a chip mounting side 10*a*, an external connection side 10*b* opposing the chip mounting side 10*a*, and a plurality of conductive through-silicon vias (TSVs) 100 connecting the chip mounting side 10*a* and the external connection side 10*b*, and a redistribution layer (RDL) 12 is formed on the chip mounting side 10*a* and is electrically connected to the conductive through-silicon vias 100. Next, a semiconductor chip 11 is electrically bonded to the redistribution layer 12 through its electrode pads 110 thereon via a plurality of solder bumps 111, and an underfill 112 is filled between the semiconductor chip 11 and the through-silicon interposer 10 to cover the solder bumps 111, and then an encapsulant 14 is formed on the through-silicon interposer 10 to encapsulate the semiconductor chip 11 and the underfill 12. Thereafter, a package substrate 1*a* is electrically bonded to the conductive through-silicon vias 100 through its solder pads 160 thereon via a plurality of conductive bumps 16 of controlled collapse chip connection (C4 specification), and another underfill 17 is filled between the through-silicon interposer 10 and the package substrate 1*a* to cover the conductive bumps 16. Finally, a plurality of solder balls 19 are connected to a bottom side of the package substrate 1*a* for external connection of a circuit board (not shown).

However, in the conventional semiconductor package 1, the package substrate 1*a* needs to carry the semiconductor chip 11 having the high density electrode pads 110 via the through-silicon interposer 10, and the solder pads 160 of the package substrate 1*a* need to be connected to the through-silicon interposer 10 via the plurality of conductive bumps 16 of C4 specification. Therefore, it is necessary to add a cumbersome process of manufacturing the through-silicon interposer 10 and conduct a special process of manufacturing the conductive bumps 16 of C4 specification, which makes it difficult to simplify the process of the semiconductor package 1 and significantly increases the manufacturing cost.

In addition, the package substrate 1*a* is made of an organic material and has a core layer and a dielectric layer, and the package substrate 1*a* has a coefficient of thermal expansion (CTE) mismatched with a coefficient of thermal expansion of the through-silicon interposer 10. Thus, uneven thermal stress is prone to occur, resulting in a significant warpage of the package substrate 1*a* during the thermal cycle, which may cause reliability problems such as poor soldering (e.g., dropping of the solder balls 19), non-wetting of the solder balls 19, or cracking of the package substrate 1*a*.

Therefore, how to overcome the various problems of the above-mentioned prior art has become an urgent issue to be solved.

SUMMARY

In view of the aforementioned shortcomings of the prior art, a package substrate is provided, which comprises: a wiring structure having a first side and a second side opposing the first side, wherein the wiring structure includes at least one first dielectric layer being an Ajinomoto build-up film and a first wiring layer formed on the first dielectric layer; a second dielectric layer formed on the second side of the wiring structure, wherein the second dielectric layer has a coefficient of thermal expansion less than a coefficient of thermal expansion of the first dielectric layer; a second wiring layer bonded with the second dielectric layer and electrically connected to the first wiring layer; and an external structure disposed on the first side of the wiring structure, wherein the external structure includes a third dielectric layer formed on the first dielectric layer and conductors embedded in the third dielectric layer and electrically connected to the first wiring layer, wherein the third dielectric layer is made of a photosensitive polyimide material, and the coefficient of thermal expansion of the first dielectric layer is less than a coefficient of thermal expansion of the third dielectric layer.

A method of manufacturing a package substrate is also provided, the method comprises: disposing a wiring structure of coreless type on each of two opposing sides of a carrier, wherein the wiring structure has a first side and a second side opposing the first side, and the wiring structure is disposed on the carrier via the first side thereof, wherein the wiring structure includes at least one first dielectric layer being an Ajinomoto build-up film and a first wiring layer formed on the first dielectric layer; bonding a second dielectric layer on the second side of each of the wiring structures to form wiring board bodies, wherein the second dielectric layer has a coefficient of thermal expansion less than a coefficient of thermal expansion of the first dielectric layer; removing the carrier to obtain the wiring board bodies; disposing the wiring board bodies on two opposite sides of a support member via the second dielectric layers of the wiring board bodies such that the first side of each of the wiring structures faces outward; forming an external structure on the first side of the wiring structure of each of the wiring board bodies, wherein the external structure includes a third dielectric layer formed on the first dielectric layer and conductors embedded in the third dielectric layer and electrically connected to the first wiring layer, wherein the coefficient of thermal expansion of the first dielectric layer is less than a coefficient of thermal expansion of the third dielectric layer; removing the support member to expose the second dielectric layer; and forming a second wiring layer on the second dielectric layer, wherein the second wiring layer is electrically connected to the first wiring layer.

In the aforementioned package substrate and method, the second wiring layer is formed with a plurality of solder balls thereon.

In the aforementioned package substrate and method, the conductors are exposed from the third dielectric layer and bonded with conductive components.

An electronic package is also provided, which comprises: the aforementioned package substrate; and at least one electronic component disposed on the external structure and electrically connected to the conductors.

A method of manufacturing an electronic package is also provided, the method comprises: providing the aforementioned package substrate; and disposing at least one electronic component on the external structure and electrically connecting the electronic component to the conductors.

In the aforementioned electronic package and method, the electronic component is electrically connected to the conductors via a plurality of conductive components.

As can be understood from the above, in the electronic package, the package substrate and the manufacturing method thereof according to the present disclosure, the external structure is designed to replace the conventional through-silicon interposer. Thus, as compared with the prior art, the electronic package can simplify the manufacturing process and reduce the manufacturing cost.

Furthermore, the CTE configuration of each layer of the package substrate is gradually increasing or decreasing, that is, the second side of the wiring structure is configured with the second dielectric layer that has the smallest CTE, and the first side of the wiring structure is configured with the third dielectric layer that has the largest CTE, in order to avoid too large a change in CTE of the wiring structure between the first side and the second side, and thus to avoid warpage from occurring to the package substrate. Hence, as compared to the prior art, after the electronic package undergoes the process of multiple environmental temperature changes, the electronic package can be effectively prevented from deforming and warping, so as to prevent the solder balls from coming off or breaking and other problems.

BRIEF DESCRIPTION OF THE DRAWINGS

The embodiments herein may be better understood by referring to the following description in conjunction with the accompanying drawings in which like reference numerals indicate identically or functionally similar elements, of which.

DETAILED DESCRIPTION

Figure 1:
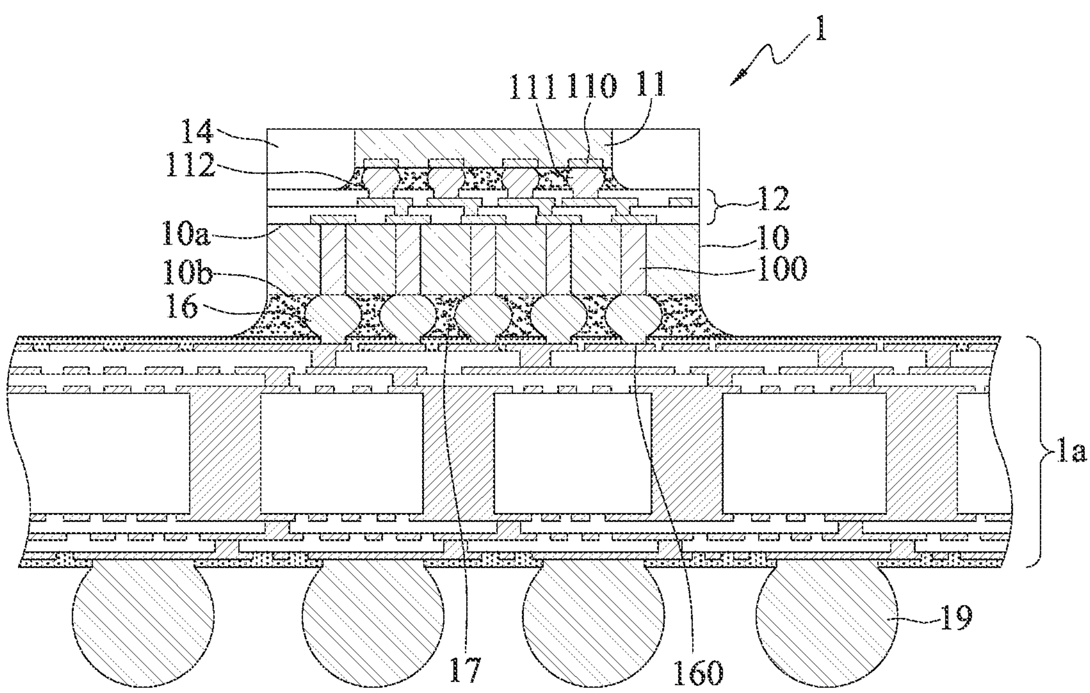
FIG. 1 is a schematic cross-sectional view of a conventional semiconductor package of the prior art.

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios, or sizes are construed as falling within the scope covered by the technical contents disclosed herein. Meanwhile, terms such as "on," "above," "below," "first," "second," "a," "one," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

FIG. 2A to FIG. 2H are schematic cross-sectional views illustrating an exemplary embodiment of a manufacturing method of a package substrate 2 according to the present disclosure.

Figure 2A:
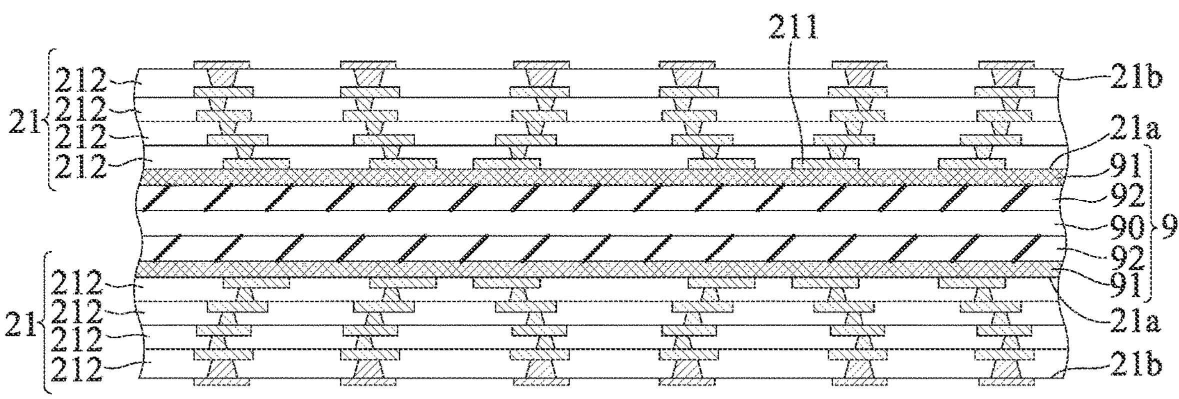
FIG. 2A to FIG. 2H are schematic cross-sectional views illustrating an exemplary manufacturing method of a package substrate according to the present disclosure.

As shown in FIG. 2A, a carrier 9 is provided to be formed with a wiring structure 21 on each of two opposite sides of the carrier 9 in a symmetrical manner.

In an embodiment, the carrier 9 may be a temporary carrier board and may be a board with metal layers on two opposite sides, such as, e.g., a copper foil substrate. A metal layer 92 may be formed on each of two opposite surfaces of a board body 90 of the carrier 9, and the metal layer 92 may be bonded with the wiring structure 21 via a peeling layer 91.

Furthermore, each of the wiring structures 21 is of the coreless type and is defined with a first side 21*a* and a second side 21*b* opposing the first side 21*a*, and the wiring structure 21 is bonded with the peeling layer 91 via the first side 21*a* thereof.

In addition, the wiring structure 21 includes a plurality of first dielectric layers 212 and a plurality of first wiring layers 211 each formed on the first dielectric layer 212, and some of the first wiring layers 211 of the wiring structures 21 are exposed from the second side 21*b* of the first dielectric layers 212. For example, the first wiring layer 211 may be applied with a redistribution layer (RDL) specification, and the first dielectric layer 212 may be an Ajinomoto Build-Up Film® (ABF) and made of dielectric material, and the first dielectric layer 212 may have a coefficient of thermal expansion (CTE) of 13 ppm/° C. to 17 ppm/° C.

Moreover, the first wiring layer 211 may be made by electroplating metal (such as, e.g., copper) using a build-up process or other manners, with a Line/Spacing (L/S) of about 10/10 micrometers (μm). It should be understood that by using the build-up process, the number of layers of the first dielectric layers 212 can be designed according to the requirements of the wiring structures 21 to form the desired number of layers of the first wiring layers 211.

Therefore, by using a dielectric material that is free of glass fibers, such as ABF material, as the first dielectric layer 212, it is advantageous to form smaller laser blind vias (vertical lines) or smaller fine Line/fine Spacing (L/S) wiring (e.g., the first wiring layer 211) due to the lack of glass fiber limitation, thereby increasing the density of the wiring.

Figure 2B:
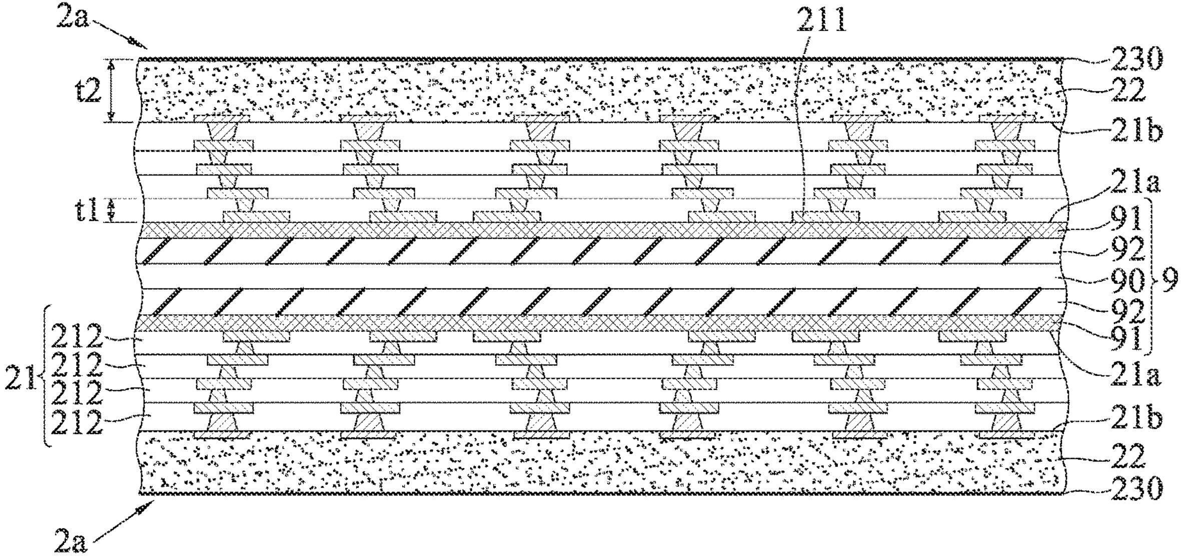

As shown in FIG. 2B, a second dielectric layer 22 is formed on each of the wiring structures 21 by lamination to form wiring board bodies 2*a*.

In an embodiment, an extremely thin metal layer 230 is formed on the second dielectric layer 22 and has a thickness of at most 3 micrometers. For example, the second dielectric layer 22 may be made of materials such as, e.g., polybenzoxazole (PBO), polyimide (PI), prepreg (PP) with glass fiber, or other dielectric materials.

Furthermore, in a case where the second dielectric layer 22 is made of PP, its CTE is 10 ppm/° C., which is less than the CTE of the first dielectric layer 212 (ABF layer). Additionally, the second dielectric layer 22 (PP layer) has a thickness t2 that is greater than a thickness t1 of the first dielectric layer 212 (ABF layer).

Figure 2C:
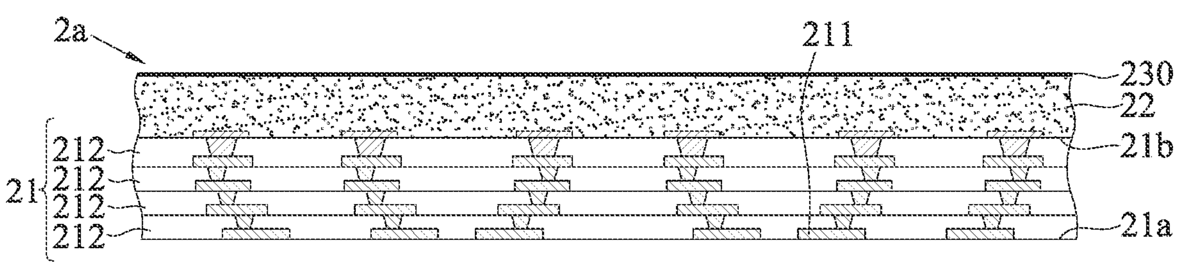
Figure 2C:
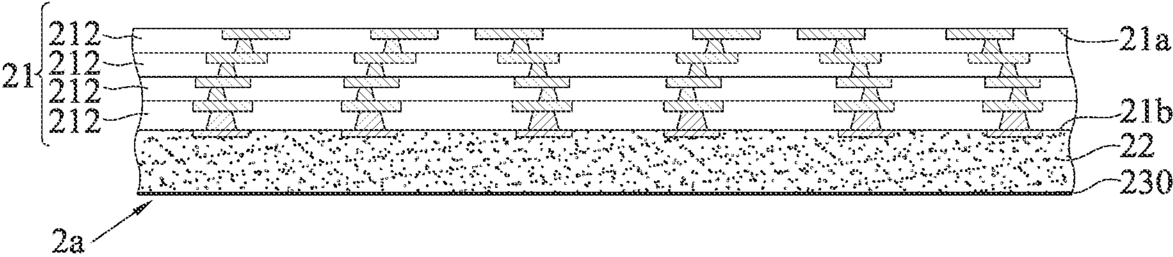

As shown in FIG. 2C, the carrier 9 and the wiring board bodies 2*a* are separated via the peeling layers 91 (shown in FIGS. 2A and 2B), so that a plurality of the wiring board bodies 2*a* are obtained and the first side 21*a* of each of the wiring structures 21 is exposed.

Figure 2D:
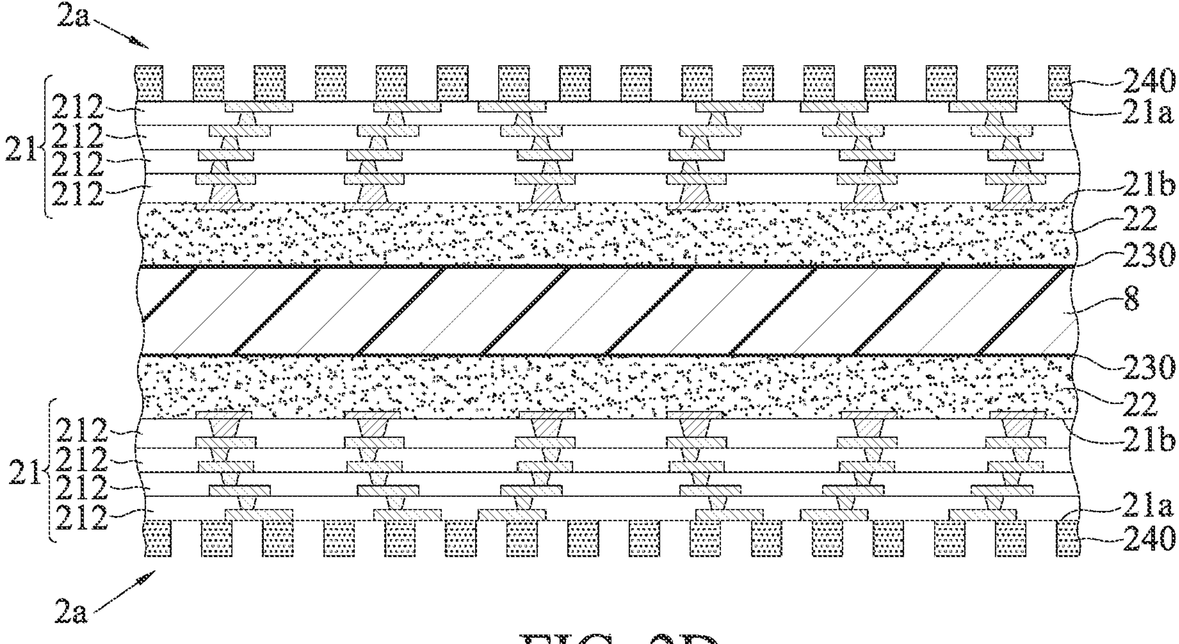
Figure 2E:
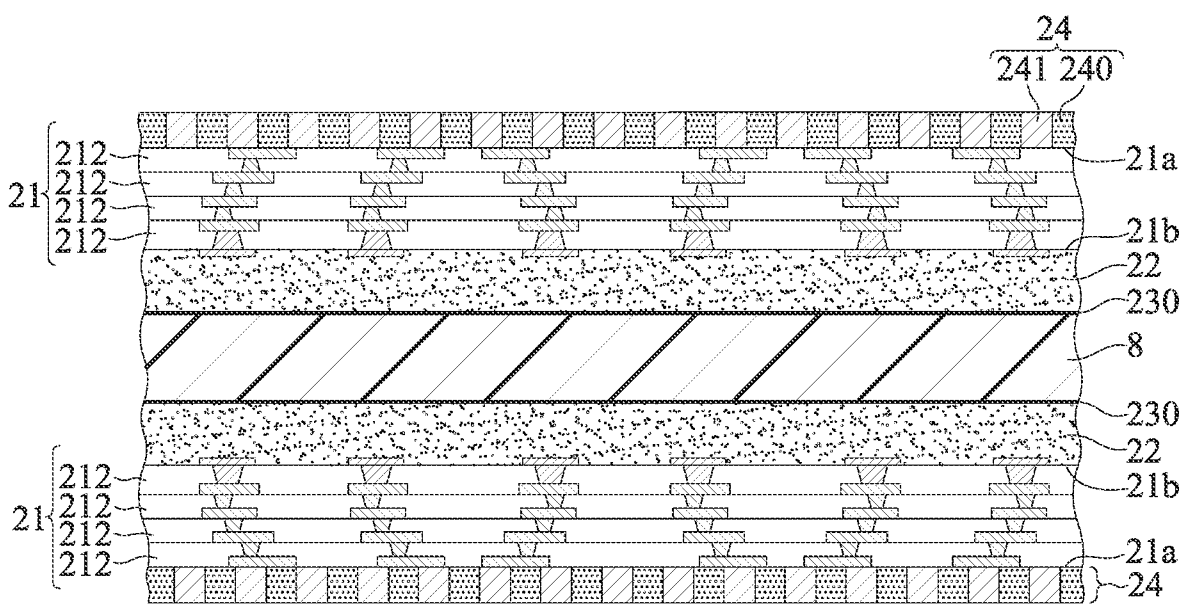

As shown in FIG. 2D, a support member 8 is provided, and two wiring board bodies 2*a* are respectively and symmetrically bonded to two opposite sides of the support member 8. Next, as shown in FIG. 2E, an external structure 24 is formed on each of the wiring board bodies 2*a*.

In an embodiment, the support member 8 is a thermal release film, and each of the wiring board bodies 2*a* is laminated on the support member 8 via the metal layer 230 of the second dielectric layer 22 thereof, so that the first side 21*a* of each of the wiring structures 21 faces outward.

Furthermore, as shown in FIGS. 2D-2H, the external structure 24 includes a third dielectric layer 240 formed on the first dielectric layer 212, and includes conductors 241 bonded to the third dielectric layer 240 to be electrically connected to the first wiring layer 211. For instance, the external structure 24 is made by a patterning process to form a plurality of openings in the third dielectric layer 240 in an exposure and development manner, and then the conductors 241 are formed in these openings by electroplating. Thus, the conductors 241 can be deemed as copper pillars of the RDL specification and are embedded in the third dielectric layer 240 so as to have surfaces that flush with or lower than a surface of the third dielectric layer 240.

In addition, the third dielectric layer 240 is made of a photosensitive material, such as polybenzoxazole (PBO), polyimide (PI), or other photosensitive dielectric materials, and a Line/Spacing (L/S) of the conductor 241 is about 2/2 μm to 5/5 μm.

Additionally, the third dielectric layer 240 and the second dielectric layer 22 are made of different materials. For instance, the third dielectric layer 240 may be made of a photosensitive PI material with a coefficient of thermal expansion (CTE) of 30 ppm/° C. to 35 ppm/° C., which is greater than the CTE of the first dielectric layer 212 (ABF layer).

Figure 2F:
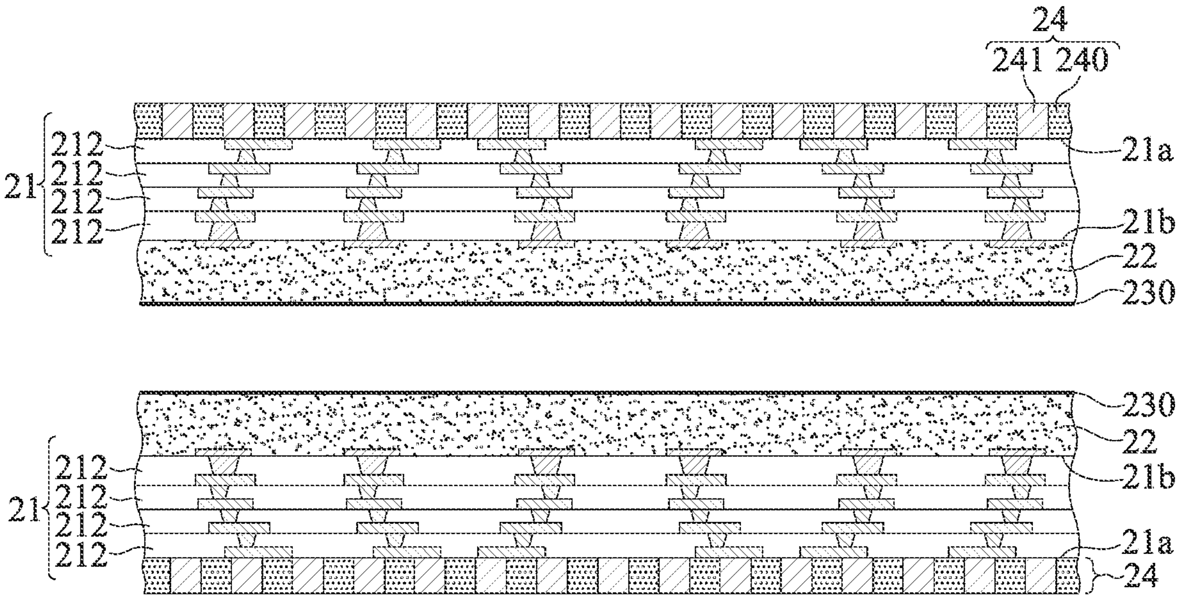

As shown in FIG. 2F, the support member 8 (see e.g., FIG. 2E) is heated to separate the support member 8 from the metal layers 230.

Figure 2G:
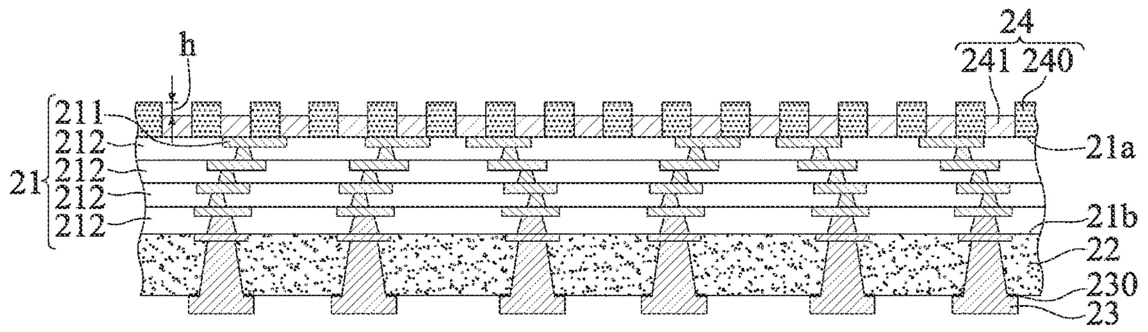

As shown in FIG. 2G, a patterning wiring process is performed via the metal layer 230 to form a second wiring layer 23 on the second dielectric layer 22.

In an embodiment, a patterned resistive layer such as a dry film (not shown) may be disposed on the metal layer 230 and the third dielectric layer 240, respectively, and then a copper layer may be electroplated on the metal layer 230 in the resistive layer by using the metal layer 230 as a seed layer for being the second wiring layer 23. Afterward, these resistive layers and the underlying metal layer 230 are removed.

Furthermore, in a case where the metal layer 230 is removed by etching, a portion of the conductor 241 may be removed by micro-etching, so that a surface of the conductor 241 is lower than a surface of the third dielectric layer 240, with a height difference h of about 3 micrometers as shown in FIG. 2G.

In addition, a thicker second dielectric layer 22 is used, so that a Line/Spacing (L/S) of the second wiring layer 23 is greater than 50/50 micrometers.

Figure 2H:
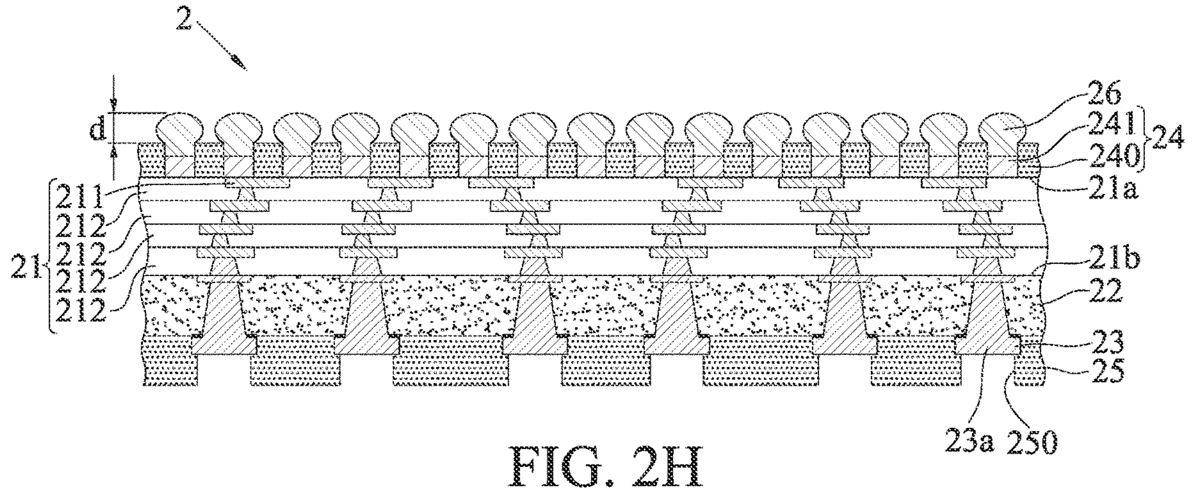

As shown in FIG. 2H, an insulating protective layer 25 such as a solder mask is formed on the second dielectric layer 22, and a plurality of conductive components 26 such as solder bumps (solder paste) are formed on the conductors 241. As such, the package substrate 2 is obtained.

In an embodiment, the insulating protective layer 25 has a plurality of openings 250 for exposing the second wiring layer 23, so that the exposed portions of the second wiring layer 23 are used as electrical contact pads 23*a*.

Moreover, the conductive component 26 may be stuck into the third dielectric layer 240 and may protrude from the third dielectric layer 240, e.g., with a protruding height d of 1 μm to 5 μm because the surface of the conductor 241 is lower than the surface of the third dielectric layer 240.

Figure 3:
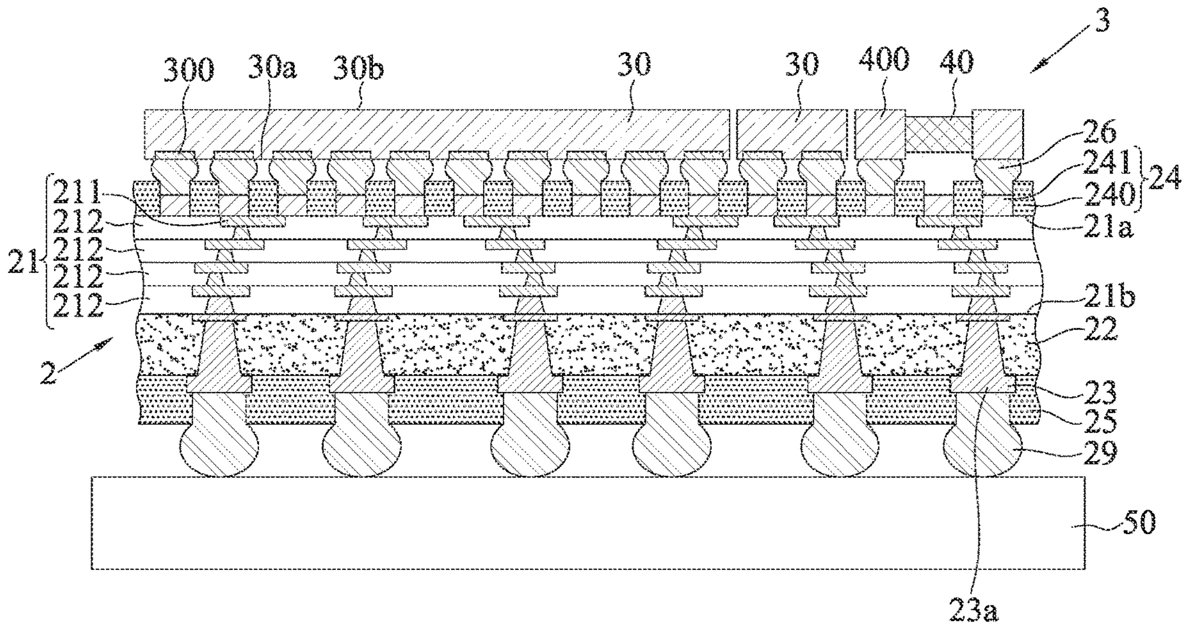
FIG. 3 is a schematic cross-sectional view showing an exemplary subsequent process of FIG. 2H.

Furthermore, as shown in FIG. 3, in a subsequent process, the package substrate 2 is bonded with at least one electronic component 30, 40 via the conductive components 26, thereby obtaining an electronic package 3, and the package substrate 2 is bonded with a circuit board 50 by a plurality of solder balls 29 via the electrical contact pads 23*a* thereof. For instance, the package substrate 2 uses low temperature solder paste for the solder balls 29, thus a reflow temperature of the solder balls 29 is lower than a reflow temperature of the conductive components 26.

The electronic components 30 and 40 are active components such as semiconductor chips, inactive components such as resistors, capacitors, or inductors, or a combination thereof. For instance, in a case where the electronic component 30 is a semiconductor chip having an active surface 30*a* and an inactive surface 30*b* opposing the active surface 30*a*, and the active surface 30*a* has a plurality of electrode pads 300 and faces down (such as a flip-chip manner), and the electrode pads 300 are electrically connected to the conductors 241 via the conductive components 26. Alternatively, in a case of the electronic component 40 is an inactive component, electrode pads 400 of the electronic component 40 are electrically connected to the conductors 241 via the conductive components 26.

Furthermore, the conductive components 26 protrude from the third dielectric layer 240 to facilitate the alignment of the electronic components 30, 40. Since solder paste is used as the conductive components 26, when the electronic components 30, 40 are bonded onto the package substrate 2, the conductive components 26 partially evaporate after reflow to reduce a distance between the electronic components 30, 40 and the third dielectric layer 240, and even bring them close to each other to facilitate the thinning of the electronic package 3.

Therefore, in the manufacturing method according to the present disclosure, the external structure 24 is designed to replace the conventional through-silicon interposer, and thus the configuration of the conventional through-silicon interposer and the conductive bumps of C4 specification can be omitted. Compared with the prior art, the electronic package 3 can simplify the manufacturing process and reduce the manufacturing cost.

Moreover, the CTEs of the various layers of the package substrate 2 (e.g., the first dielectric layer 212, the second dielectric layer 22 and the third dielectric layer 240) are configured such that the CTE increases from the solder balls 29 toward the conductive components 26, that is, the CTE of the second dielectric layer 22 is the smallest, the CTE of the first dielectric layer 212 is the second largest, and the CTE of the third dielectric layer 240 is the largest, in order to avoid too large a change in the CTE of the wiring structure 21 between the first side 21_a_ and the second side 21_b_, and thus to avoid warpage from occurring to the package substrate 2. Thus, as compared to the prior art, after the electronic package 3 undergoes the process of multiple environmental temperature changes, the electronic package 3 can be effectively prevented from deforming and warping, so as to prevent the solder balls 29 from coming off or breaking and other problems.

In addition, by using a thermal release film as the support member 8, the wiring structures 21 are provided on two opposite sides of the support member 8 respectively to facilitate mass production.

Furthermore, in the external structure 24, a photosensitive PI material is used as the third dielectric layer 240 to facilitate the formation of a plurality of high-density and small-sized openings, so that the conductors 241 can meet the requirements of a high-density and small-sized array arrangement.

A package substrate 2 is also provided in the present disclosure, and the package substrate 2 comprises a wiring structure 21 of coreless type, a second dielectric layer 22, a second wiring layer 23 and an external structure 24.

The wiring structure 21 has a first side 21_a_ and a second side 21_b_ opposing the first side 21_a_, wherein the wiring structure 21 includes at least one first dielectric layer 212 and a first wiring layer 211 formed on the first dielectric layer 212, and the first dielectric layer 212 is an Ajinomoto build-up film.

The second dielectric layer 22 is formed on the second side 21_b_ of the wiring structure 21, wherein the second dielectric layer 22 has a coefficient of thermal expansion less than a coefficient of thermal expansion of the first dielectric layer 212.

The second wiring layer 23 is bonded with the second dielectric layer 22 and electrically connected with the first wiring layer 211.

The external structure 24 is disposed on the first side 21_a_ of the wiring structure 21, wherein the external structure 24 has a third dielectric layer 240 formed on the first dielectric layer 212 and conductors 241 embedded in the third dielectric layer 240 and electrically connected to the first wiring layer 211, and the coefficient of thermal expansion of the first dielectric layer 212 is less than a coefficient of thermal expansion of the third dielectric layer 240.

In an embodiment, the second wiring layer 23 is formed with a plurality of solder balls 29 thereon.

In an embodiment, the conductors 241 are exposed from the third dielectric layer 240 and bonded with conductive components 26.

An electronic package 3 is also provided in the present disclosure, and the electronic package 3 comprises the package substrate 2 and at least one electronic component 30, 40 disposed on the external structure 24 and electrically connected with the conductors 241.

In an embodiment, the electronic components 30, 40 are electrically connected to the conductors 241 via the conductive components 26.

In summary, in the electronic package, the package substrate and the manufacturing method thereof according to the present disclosure, the external structure is designed to omit the configuration of the conventional through-silicon interposer, and the conductive bumps of C4 specification can be omitted, whereby the electronic package can simplify the manufacturing process and reduce the manufacturing cost.

Furthermore, the CTE configuration of each layer of the package substrate is gradually increasing or decreasing, that is, the second side of the wiring structure is configured with the second dielectric layer that has the smallest CTE, and the first side of the wiring structure is configured with the third dielectric layer that has the largest CTE, in order to avoid too large a change in CTE of the wiring structure between the first side and the second side, and thus to avoid warpage from occurring to the package substrate. Hence, as compared to the prior art, after the electronic package undergoes the process of multiple environmental temperature changes, the electronic package can be effectively prevented from deforming and warping, so as to prevent the solder balls from coming off or breaking and other problems.

The foregoing disclosure has included specific embodiments. However, it will be apparent to one of skill in the art that other variations and modifications may be made to the described embodiments, with the attainment of some or all of their advantages. Accordingly this disclosure is to be taken only by way of example and is not intended to otherwise limit the scope of the embodiments herein. Therefore, it is the object of the appended claims to cover all such variations and modifications as come within the true spirit and scope of the embodiments herein.

What is claimed is:

1. A package substrate, comprising:

a wiring structure having a first side and a second side opposing the first side, wherein the wiring structure includes at least one first dielectric layer being an Ajinomoto build-up film and a first wiring layer formed on the first dielectric layer;

a second dielectric layer formed on the second side of the wiring structure, wherein the second dielectric layer has a coefficient of thermal expansion less than a coefficient of thermal expansion of the first dielectric layer at same temperature, and a thickness of the second dielectric layer is greater than a thickness of the first dielectric layer;

a second wiring layer bonded with the second dielectric layer and electrically connected to the first wiring layer; and an external structure disposed on the first side of the wiring structure, wherein the external structure includes a third dielectric layer formed on the first dielectric layer and conductors embedded in the third dielectric layer and electrically connected to the first wiring layer, wherein the third dielectric layer is made of a photosensitive polyimide material, and the coefficient of thermal expansion of the first dielectric layer is less than a coefficient of thermal expansion of the third dielectric layer at same temperature.

2. The package substrate of claim 1, wherein the second wiring layer is formed with a plurality of solder balls thereon.

3. The package substrate of claim 1, wherein the conductors are exposed from the third dielectric layer and bonded with conductive components.

4. An electronic package, comprising:
the package substrate of claim 1; and
at least one electronic component disposed on the external structure and electrically connected to the conductors.

5. The electronic package of claim 4, wherein the electronic component is electrically connected to the conductors via a plurality of conductive components.

6. A method of manufacturing an electronic package, the method comprising:
providing the package substrate of claim 1; and
disposing at least one electronic component on the external structure and electrically connecting the electronic component to the conductors.

7. The method of claim 6, wherein the electronic component is electrically connected to the conductors via a plurality of conductive components.

8. A method of manufacturing a package substrate, the method comprising:
disposing a wiring structure of coreless type on each of two opposing sides of a carrier, wherein the wiring structure has a first side and a second side opposing the first side, and the wiring structure is disposed on the carrier via the first side thereof, wherein the wiring structure includes at least one first dielectric layer being an Ajinomoto build-up film and a first wiring layer formed on the first dielectric layer;
bonding a second dielectric layer on the second side of each of the wiring structures to form wiring board bodies, wherein the second dielectric layer has a coefficient of thermal expansion less than a coefficient of thermal expansion of the first dielectric layer at same temperature;
removing the carrier to obtain the wiring board bodies;
disposing the wiring board bodies on two opposite sides of a support member via the second dielectric layers of the wiring board bodies such that the first side of each of the wiring structures faces outward;
forming an external structure on the first side of the wiring structure of each of the wiring board bodies, wherein the external structure includes a third dielectric layer formed on the first dielectric layer and conductors embedded in the third dielectric layer and electrically connected to the first wiring layer, wherein the coefficient of thermal expansion of the first dielectric layer is less than a coefficient of thermal expansion of the third dielectric layer at same temperature;
removing the support member to expose the second dielectric layer; and
forming a second wiring layer on the second dielectric layer, wherein the second wiring layer is electrically connected to the first wiring layer.

9. The method of claim 8, wherein the second wiring layer is formed with a plurality of solder balls thereon.

10. The method of claim 8, wherein the conductors are exposed from the third dielectric layer and bonded with conductive components.

* * * * *